United States Patent
Kang et al.

(10) Patent No.: US 6,388,299 B1
(45) Date of Patent: May 14, 2002

(54) SENSOR ASSEMBLY AND METHOD

(75) Inventors: Joon-Won Kang, Plymouth; Kelly J. Simonette, Coon Rapids, both of MN (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 09/208,781

(22) Filed: Dec. 10, 1998

(51) Int. Cl.⁷ ............................................. H01L 29/82
(52) U.S. Cl. ................... 257/415; 257/415; 257/417; 257/418; 257/419; 257/420; 257/424
(58) Field of Search ................. 257/415, 417, 257/418, 419, 420, 424

(56) References Cited

U.S. PATENT DOCUMENTS

| | | | |
|---|---|---|---|
| 4,812,888 A | 3/1989 | Blackburn | 357/26 |
| 4,873,871 A | 10/1989 | Bai et al. | 73/777 |
| 5,132,658 A | 7/1992 | Dauenhauser et al. | 338/92 |
| 5,155,061 A | 10/1992 | O'Connor et al. | 437/86 |
| 5,500,549 A | 3/1996 | Takeuchi et al. | 257/415 |
| 5,503,017 A | 4/1996 | Mizukoshi | 73/514.36 |
| 5,504,356 A | 4/1996 | Takeuchi et al. | 257/254 |
| 5,541,437 A | 7/1996 | Watanabe et al. | 257/417 |
| 5,572,057 A | 11/1996 | Yamamoto et al. | 257/417 |
| 5,576,251 A | 11/1996 | Garabedian et al. | 437/228 |
| 5,578,843 A | 11/1996 | Garabedian et al. | 257/254 |
| 5,622,633 A | 4/1997 | Ohtsuka et al. | 438/53 |
| 5,627,397 A | 5/1997 | Kano et al. | 257/417 |
| 5,668,033 A | 9/1997 | Ohara et al. | 438/113 |

OTHER PUBLICATIONS

Chavan, Abhijeet V. et al., A Batch–Processed Vacuum–Sealed Capacitive Pressure Sensor *Trandsducers '97* (1997) pp. 1449–1452.

De Bruin, D. W. et al., "Electrically Trimmable Silicon Micromachined Pressure Switch," *Sensors and Actuators*, A21–A23 (1990) pp. 54–57.

Guckel, H., "Surface Micromachined Pressure Transducers," *Sensors and Actuators*, A28 (1991) pp. 133–146.

Huff, Michael A. et al., "A Threshold Pressure Switch Utilizing Plastic Deformation of Silicon," *Transducers '91* (1991) pp. 177–180.

*Primary Examiner*—Eddie Lee
*Assistant Examiner*—Edgardo Ortiz
(74) *Attorney, Agent, or Firm*—Kris T. Fredrick

(57) ABSTRACT

A sensor device that provides a relatively uniform electric field between a diaphragm and a substrate, regardless of the displacement of the diaphragm is disclosed. The sensor device provides a uniform spacing between the diaphragm and the substrate over a selected range of diaphragm displacements. A double layer diaphragm is disclosed that includes an upper support member and a lower electrode plate. The lower electrode plate is attached to the upper support member by a post member, and the post member is only attached to the center region of the support member. In another embodiment, an electro-mechanically controlled switch sensor is provided that uses an electrostatic force between the diaphragm and the substrate to produce a bi-stable snapping action.

37 Claims, 14 Drawing Sheets

Prior Art

SENSOR ASSEMBLY AND METHOD

BACKGROUND OF THE INVENTION

This invention relates to the field of sensors, and more particularly, to solid-state sensors that use spaced electrodes to measure parameters such as pressure, acceleration, etc. This invention also relates to methods for fabricating such devices.

Interest in the development of solid-state sensors has increased dramatically in recent years. Solid-state sensors, and in particular solid-state pressure sensors, have found wide spread application in many areas including industrial process controls, automobile engine monitoring, and biomedicine. Solid-state pressure sensors typically include a sealed cavity with a diaphragm that deforms geometrically in response to an applied pressure or pressures. Many times, the construction of the sealed cavity involves micro-machining a substrate to form one or more silicon diaphragms and bonding the micro-machined substrate to a sensor substrate.

For many pressure sensors, the magnitude of the geometric deformation or flexure of the diaphragm is proportional to the applied pressure. There are a number of approaches for measuring the degree that the diaphragm deforms or flexes. One approach is to diffuse a piezoresistive-type resistor into the diaphragm. By measuring the stress-induced changes in the resistivity of the piezoresistive resistors, the flexure of the diaphragm can be determined. Another approach is to provide a conductive plate adjacent to the diaphragm. By applying an AC signal between the diaphragm and the conductive plate, the capacitance between the diaphragm and a conductive plate can be measured. The amount of capacitance is related to the degree that the diaphragm is deformed.

Another approach is to use a Movable Gate Field Effect Transistor (MOGFET), as suggested in U.S. Pat. No. 4,812,888 to Blackburn. Blackburn suggests a capacitive pressure transducer that uses a field-effect transistor (FET) to sense the flexure of the diaphragm. In Blackburn, the diaphragm is conductive and serves as the gate of the field effect transistor (FET). As the diaphragm deforms under an applied pressure, a portion of the diaphragm moves closer to the source and drain of the FET, which are fabricated in the substrate. This changes the resistivity of the channel that lies between the source and the drain, thereby changing the source-drain current of the FET. The amount that the diaphragm deforms can be determined by measuring the source-drain current.

Other references that disclose sensors that use a Movable Gate Field Effect Transistor (MOGFET) include U.S. Pat. No. 4,873,871 to Bai et al.; U.S. Pat. No. 5,668,033 to Ohara et al.; U.S. Pat. No. 5,578,843 to Garabedian et al.; U.S. Pat. No. 5,572,057 to Yamamoto et al.; U.S. Pat. No. 5,541,437 to Watanabe et al.; U.S. Pat. No. 5,500,549 to Takeuchi et al.; U.S. Pat. No. 5,504,356 to Takeuchi et al.; and U.S. Pat. No. 5,503,017 to Mizukoshi et al.

A limitation of many of these prior art sensor devices is that the electric field between the diaphragm and the substrate is not uniform across the diaphragm, particularly as the diaphragm deforms toward or away from the substrate. In many cases, the diaphragm is only supported around its periphery, and the center tends to move toward or away from the substrate more than the rest of the diaphragm. This tends to produce a higher electric field at the center of the diaphragm than around the edges, and this differential increases with increased diaphragm displacement. Typically, this causes the output of a capacitive, MOGFET, or other sensor type that is sensitive to the electric field between the diaphragm and the substrate to have a more complex behavior than if a uniform electric field extended across the diaphragm. In addition, the efficiency of the sensor may be reduced relative to a sensor that has a uniform electric field between the diaphragm and the substrate. What would be desirable, therefore, is a sensor device that provides a uniform electric field between the diaphragm and the substrate, regardless of the diaphragm displacement. This may have a number of advantages including simplifying the behavior and increasing the efficiency of the sensor.

Another limitation is that many of the prior art sensor devices inherently provide a pressure transducer, rather than a pressure switch. For many pressure sensing applications, detailed pressure values are not required as provided by, for example, a pressure transducer. Instead, only a few specific pressure thresholds often need to be detected, such as when the oil pressure of an engine drops below a predetermined threshold. To accommodate some of these applications, many of the prior art sensor devices use a typical pressure transducer in conjunction with an electronic threshold detector circuit. It would be desirable, therefore, to provide a pressure sensor that electro-mechanically provides a switch function so that expensive signal processing circuits are not required.

SUMMARY OF THE INVENTION

The present invention overcomes many of the disadvantages of the prior art by providing a sensor device that provides a relatively uniform electric field across a diaphragm, regardless of the displacement of the diaphragm. Preferably, this is accomplished by providing a uniform lateral spacing between the diaphragm and the substrate, over a selected range of diaphragm displacements. In one illustrative embodiment, a double layer diaphragm is provided including an upper support member and a lower electrode plate. The lower electrode plate is preferably attached to the upper support member by a post member, and the post member is preferably only attached to the center of the support member.

Using this configuration, any number of sensor types can be constructed including pressure sensors, acceleration sensors, etc. In an illustrative embodiment, a pressure transducer is provided wherein the support member forms one side of a sensor cavity. When a pressure is applied, the support member deforms. Since the electrode plate is only connected to the center region of the support member, the electrode plate does not substantially deform when the support member deforms under the applied pressure. Instead, the electrode plate tends to remain substantially non-deformed and substantially parallel to the substrate. Accordingly, the electric field between the electrode plate and the substrate remains relatively uniform across the electrode plate, regardless of the displacement of the diaphragm. This may simplify the behavior and increase the efficiency of the pressure transducer device.

The uniform electric field produced by the above illustrative embodiments can be sensed in any number of ways including, for example, using a capacitive type sensor, a MOGFET type sensor, etc. To form a capacitive type sensor, the sensor substrate may have an implant region under the electrode plate, wherein the implant region makes the substrate conductive. Alternatively, or in addition to, a metal layer may be deposited on the substrate under the electrode plate. In either case, the electrode plate is separated from the substrate and/or metal layer by a dielectric layer such as an oxide layer, an air layer, and/or a vacuum layer. By applying an AC signal between the electrode plate and the substrate and/or metal layer, the capacitance therebetween can be measured. The measured capacitance can be used to determine the spacing, and thus the desired sensor parameter.

To form a MOGFET type sensor, the substrate may have a source implant region and a drain implant region. A gap is positioned between the source implant region and the drain implant region. In this configuration, the electrode plate forms the gate of the MOGFET device. By applying a gate voltage to the electrode plate (e.g., gate) and a source-drain voltage to the source and drain implants, the spacing between the electrode plate and the substrate can be determined by measuring the resulting source-drain current. The gap may or may not include an implant.

In another illustrative embodiment, a pressure switch may be provided. The pressure switch detects when a threshold pressure of a gas or a fluid occurs and turns on one or more electric switches to activate a control device, alarm, or the like. Unlike a pressure transducer, the output of the pressure switch is ideally either "on" or "off". In an illustrative pressure switch embodiment, the electrode plate and the substrate are conductive and have a voltage applied therebetween. The voltage causes an electrostatic force between the substrate and the electrode plate, wherein the electrostatic force increases as the electrode plate moves closer to the substrate. The support member also provides a deformation force that is opposite to the applied pressure and to the electrostatic force. The deformation force also increases as the support plate moves closer to the substrate. The electrode plate may snap toward the substrate when the externally generated force and the electrostatic force overcome the deformation force. This snapping action can be used effectively to form a switch. The electrode plate may maintain a uniform lateral spacing between the itself and the substrate, or may be a more conventional single-piece diaphragm.

In one illustrative embodiment, a dielectric layer is provided between the electrode plate and the substrate to prevent a direct electrical connection when the diaphragm snaps toward the substrate. This dielectric layer may be a dielectric substance such as an oxide, or may be a gas, a vacuum, or any other layer that provides electrical insulation.

For a capacitive type sensor, the snapping action of the electrode plate, as described above, may provide a transition from a lower capacitance state to a higher capacitance state. For a MOGFET type sensor, the snapping action of the electrode plate may provide a transition from an "off" FET device to an "on" FET device.

It is recognized that the support member and the electrode plate may be designed so that little or no snapping action occurs. This may be accomplished by, for example, increasing the thickness, reducing the diameter of the support member, or decreasing the voltage applied to the electrode plate. By providing little or no snapping action, a transducer type sensor may be produced as described above.

An illustrative method for forming the two layer diaphragm structure discussed above includes: providing a substrate having an upper surface; forming a first sacrificial layer on the upper surface of the substrate; forming an electrode plate on a selected portion of first sacrificial layer, the electrode plate having an outer boundary; forming a second sacrificial layer on the electrode plate, the second sacrificial layer extending beyond the outer boundary of the electrode plate; forming a hole in the second sacrificial layer down to the electrode plate; filling the hole with a material that connects to the electrode plate, thereby forming a post structure; forming a support member on the second sacrificial layer including over the post structure, wherein the support member connects to the post structure; and removing the first and second sacrificial layers, thereby leaving a cavity around the electrode plate and at least a portion of the post structure.

It is contemplated that the second sacrificial layer may have an outer boundary, and that the support plate may extend beyond that outer boundary and down to the substrate. In this configuration, the support plate and the substrate may form a cavity.

In the illustrative method, the cavity may have one or more etching channels extending between the cavity and the exterior of the cavity. The etching channels may allow the removing step to remove the first and second sacrificial layers through the etching channels using a known process. After the first and second sacrificial layers are removed, the etching channels may be sealed. It is contemplated that the sealing step may be performed in a predetermined pressure environment to provide a predetermined pressure inside the cavity.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

The present invention provides a sensor that produces a relatively uniform electric field across a deformable diaphragm, regardless of the diaphragm displacement. In an illustrative embodiment, this is accomplished by providing a double layer deformable diaphragm including an upper support member and a lower electrode plate. The lower electrode plate is only attached to the upper support member at selected locations, such as at the center of the support plate. In this configuration, the lower electrode plate remains substantially non-deformed while the upper support member deforms to provide the diaphragm displacement. Accordingly, the spacing between the lower electrode plate and the adjacent substrate, and thus the electric field therebetween, may remain relatively uniform across the electrode plate over a wide range of diaphragm displacements.

It is contemplated that any number of sensor types can be constructed using this approach including pressure sensors, acceleration sensors, etc. It is also contemplated that the relatively uniform electric field can be sensed in any number of ways including, for example, using a capacitive type sensor, a MOGFET type sensor, etc. Finally, it is contemplated that the present invention may produce a transducer-type sensor and/or a switch-type sensor, depending on the specific design of the diaphragm, electrode, applied voltages, etc., as more fully described below.

Figure 1:
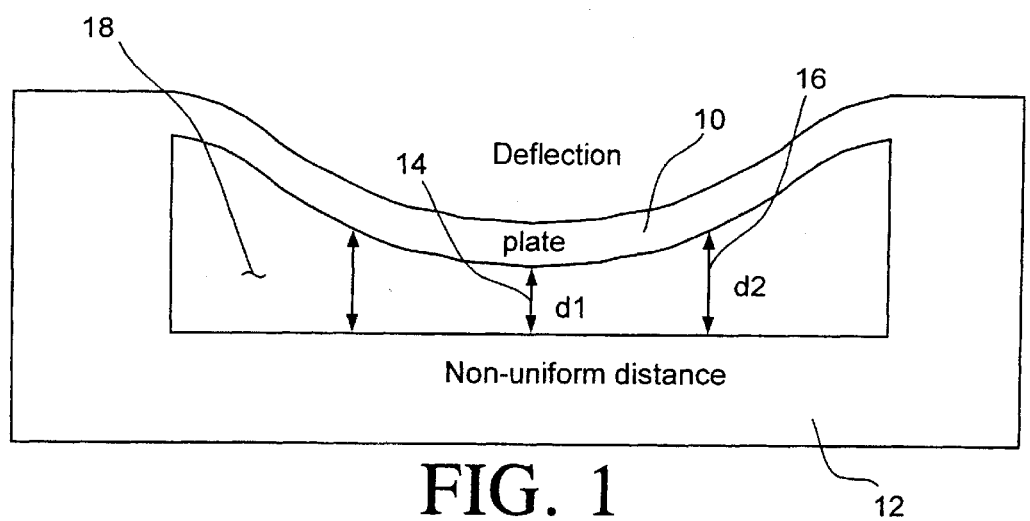
FIG. 1 is a schematic diagram showing a prior art sensor having a cavity with a deformable diaphragm and a substrate.

FIG. 1 is a schematic diagram showing a prior art pressure sensor with a deformable diaphragm 10 positioned on a substrate 12. For the illustrative pressure sensor, the diaphragm 10 and the substrate 12 form a sealed cavity 18, wherein the cavity 18 has a known pressure therein. When the pressure sensor is subject to an outside pressure that is greater than the pressure in the cavity 18, the diaphragm 10 tends to deflect toward the substrate 12, as shown. When the outside pressure is reduced relative to the pressure in the cavity, the diaphragm tends to deflect away from the substrate 12.

In many cases, the diaphragm 10 is only supported around its periphery. Thus, the center of the diaphragm 10 tends to move toward or away from the substrate more than the rest of the diaphragm 10. The distance "d1" 14 represents the distance between the center of the diaphragm 10 and the substrate 12, and the distance "d2" 16 represents the distance between an edge portion of the diaphragm 10 and the substrate 12. Because the center of the diaphragm 10 tends to move toward the substrate more than the edges of the diaphragm 10, the distance "d1" 14 is shown less than the distance "d2" 16. Thus, when a voltage is applied between the diaphragm 10 and the substrate 12, a higher electric field is produced at the center of the diaphragm 10 relative to the edges thereof. This causes a non-uniform capacitance distribution and a non-uniform electrostatic force between the diaphragm 10 and the substrate 12.

As the diaphragm becomes more and more deformed under increased outside pressure, the differential between "d1" 14 and "d2" 16 increases. Accordingly, the degree of non-uniformity of the electric field across the diaphragm 10 will tend to increase with increased pressure. For many types of sensors, such as capacitive, MOGFET, and other types of sensors that are sensitive to the electric field between the diaphragm 10 and the substrate 12, this non-uniformity can produce a sensor output that is relatively complex. Accordingly, substantial processing circuitry or the like may be required to compensate for, or remove, these complex components from the sensor output. Also, the non-uniformity in the electric field across the diaphragm may decrease the efficiency of the sensor relative to a sensor with a uniform electric field across the diaphragm.

Figure 2:
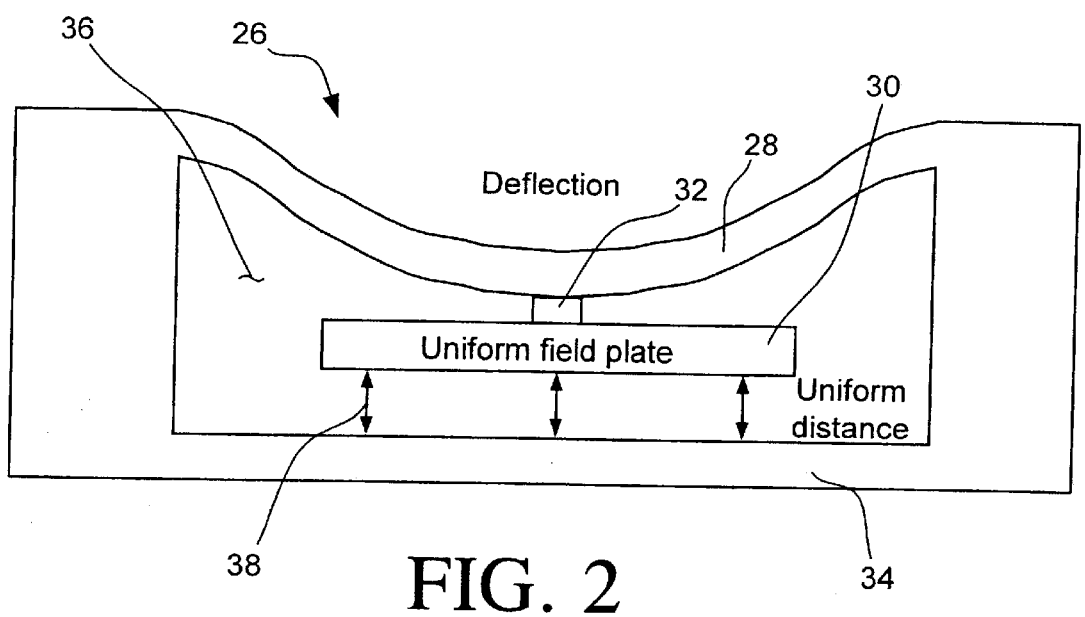
FIG. 2 is a schematic diagram showing a sensor in accordance with the present invention having a double layer diaphragm with an upper support member and a lower electrode plate.

FIG. 2 is a schematic diagram showing an illustrative pressure sensor in accordance with the present invention having a double layer diaphragm generally shown at 26. The double layer diaphragm 26 has an upper support member 28 and a lower electrode plate 30. The support member 28 and the substrate 34 are shown forming a sealed sensor cavity 36. It is contemplated that the support member 28 and lower electrode plate 30 may be circular, square, rectangular, triangular, or any other desired shape.

To help provide a uniform spacing between the diaphragm and the substrate 34, the electrode plate 30 is only connected to a center region of the support member 28, preferably by a connecting post 32. Connected in this manner, the electrode plate 30 does not substantially deform when the support member 28 deforms under applied outside pressure. Instead, the electrode plate 30 remains substantially non-deformed, and substantially parallel to the substrate 34. Accordingly, the electric field between the electrode plate 30 and the substrate 34 remains relatively uniform across the electrode plate 30, as shown at 38, regardless of the displacement of the diaphragm 26. This may simplify the behavior and increase the efficiency of the sensor.

Figure 3:
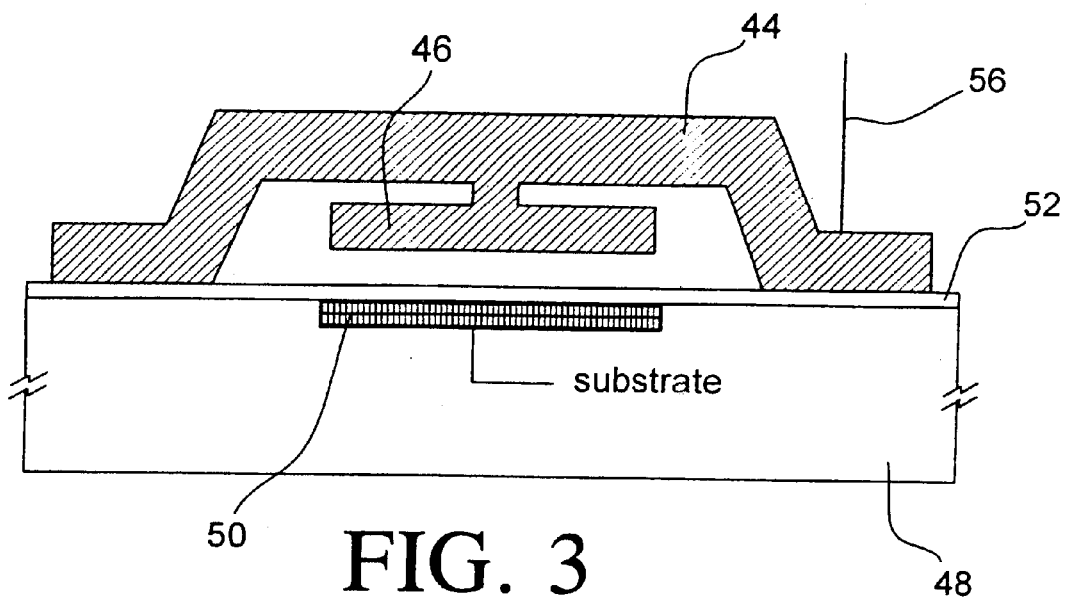
FIG. 3 is a schematic diagram showing a capacitive-type pressure sensor in accordance with an illustrative embodiment of the present invention, with the diaphragm in a substantially non-deformed position.

FIG. 3 is a schematic diagram showing a capacitive-type pressure sensor device in accordance with an illustrative embodiment of the present invention. As indicated above, the electric field between the diaphragm and the substrate can be sensed in any number of ways including, for example, using a capacitive type sensor, a MOGFET type sensor, etc. To form a capacitive type sensor, the sensor substrate 48 may have an implant region 50 positioned under the electrode plate 46. The implant region 50 makes the substrate 48 conductive. Alternatively, or in addition to, a metal layer (not shown) may be deposited on the substrate 48 under the electrode plate 46. In either case, the electrode plate 46 may be separated from the substrate 48 and/or metal layer by a dielectric layer, such as an oxide layer 52, an air layer and/or a vacuum layer.

In the illustrative embodiment, the support member 44 and the electrode plate 46 are conductive and are electrically connected to pin 56. By applying an AC signal between the electrode plate 46 (via pin 56) and the substrate 48 and/or metal layer, the capacitance therebetween can be measured. The measured capacitance can then be used to determine the spacing between the electrode plate 46 and the substrate 48, and thus the desired sensor parameter.

Figure 4:
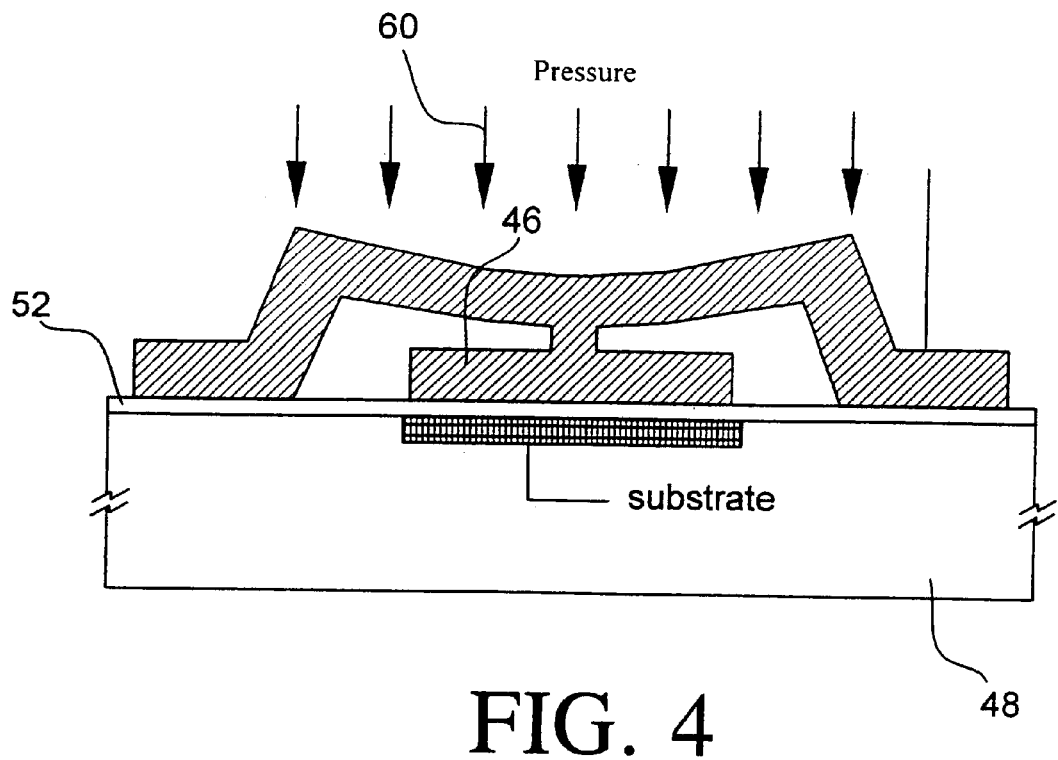
FIG. 4 is a schematic diagram showing the capacitive-type pressure sensor of FIG. 3, with the diaphragm in a deformed position.

FIG. 4 shows the capacitive-type pressure sensor of FIG. 3, with the diaphragm in a deformed position under pressure 60. The diaphragm is shown engaging the dielectric layer 52. An advantage of providing a dielectric layer 52 between the substrate 48 and the electrode plate 46 is that a direct electrical connection is not formed therebetween, regardless of the applied pressure 60.

Figure 5:
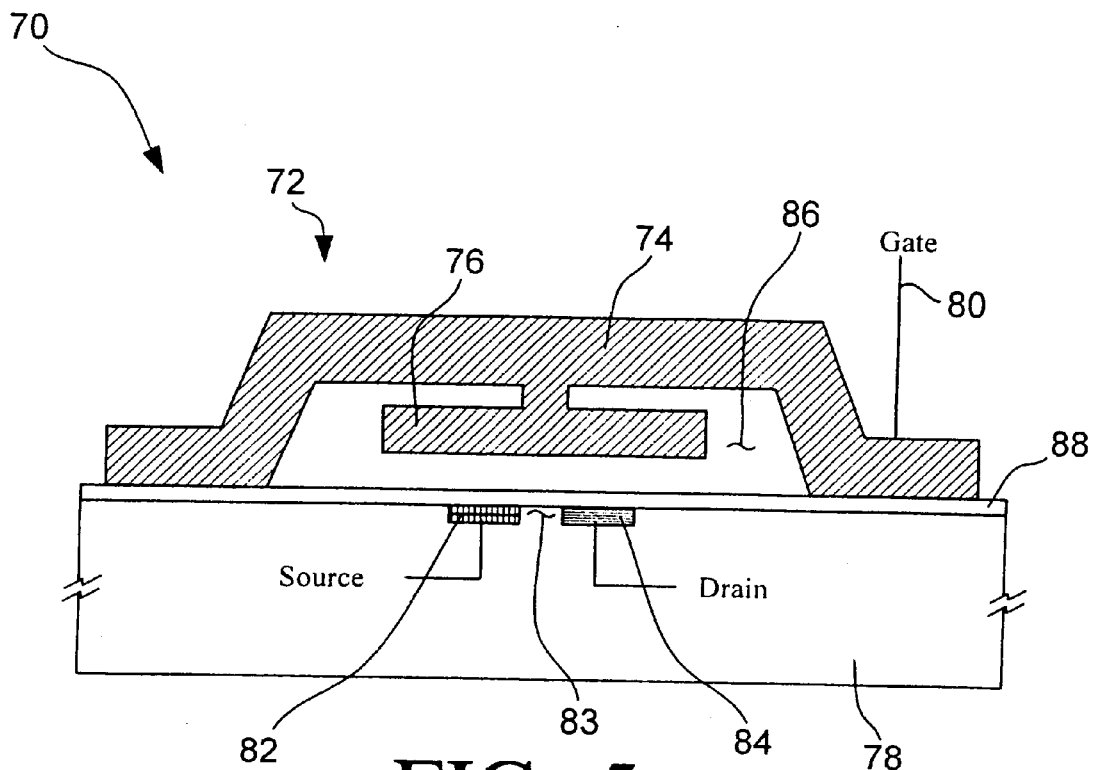
FIG. 5 is a schematic diagram showing a MOGFET-type pressure sensor in accordance with an illustrative embodiment of the present invention, with the diaphragm in a substantially non-deformed position.
Figure 6:
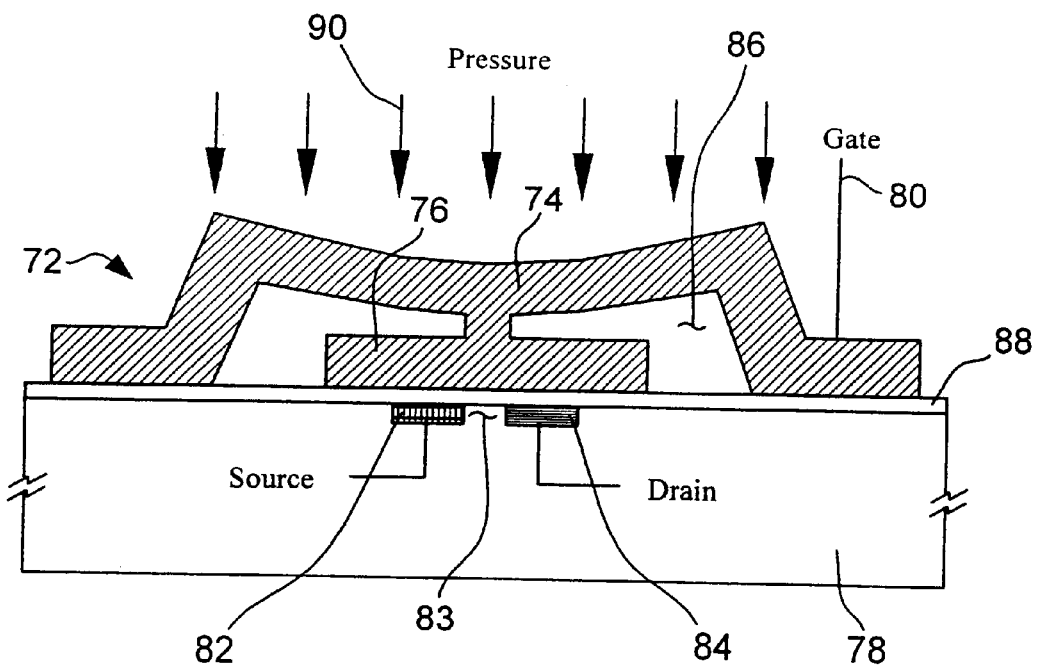
FIG. 6 is a schematic diagram showing the MOGFET-type pressure sensor of FIG. 5, with the diaphragm in a deformed position.

FIG. 5 is a schematic diagram showing a MOGFET-type pressure sensor in accordance with an illustrative embodiment of the present invention, with the diaphragm in a substantially non-deformed position. FIG. 6 shows the MOGFET-type pressure sensor of FIG. 5 with the diaphragm in a deformed position under pressure 90. In this embodiment, the substrate 78 has a source implant region 82 and a drain implant region 84. A gap 83 is provided between the source implant region 82 and the drain implant region 84. In this configuration, the electrode plate 76 forms the gate of the MOGFET device.

By applying a gate voltage to the electrode plate (e.g. via pin 80), and a source-drain voltage between the source implant region 82 and drain implant region 84, the spacing between the electrode plate 76 and the substrate 78 can be determined by measuring the resulting source-drain current. That is, with sufficient voltage applied to the electrode plate 76, an inversion region (or channel) forms in the gap 83 between the source implant region 82 and the drain implant region 84. The channel provides a reduced resistance path between the source implant region 82 and drain implant region 84, thereby allowing a corresponding increase in source-drain current flow.

In one embodiment of the present invention, the electrode plate 76 is sufficiently spaced from the substrate 78 so that the MOGFET device is essentially "off" until a threshold pressure is applied. Once the threshold pressure is applied, the support plate 74 deforms sufficiently to "turn on" the MOGFET device. This configuration may be especially suitable for use in a pressure switch type sensor.

Figure 7:
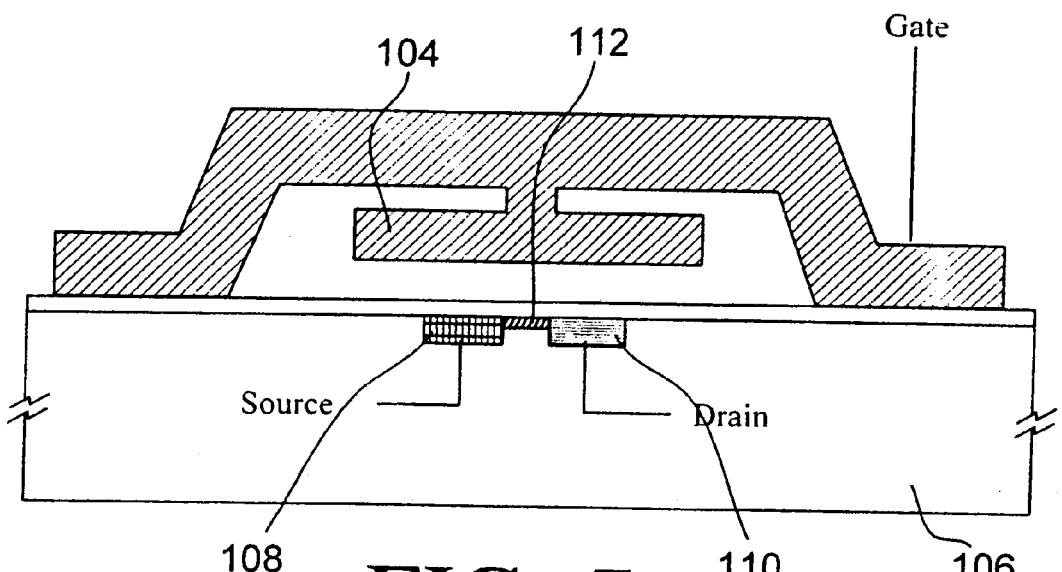
FIG. 7 is a schematic diagram showing a MOGFET-type pressure sensor with a channel implant in accordance with another illustrative embodiment of the present invention.
Figure 8:
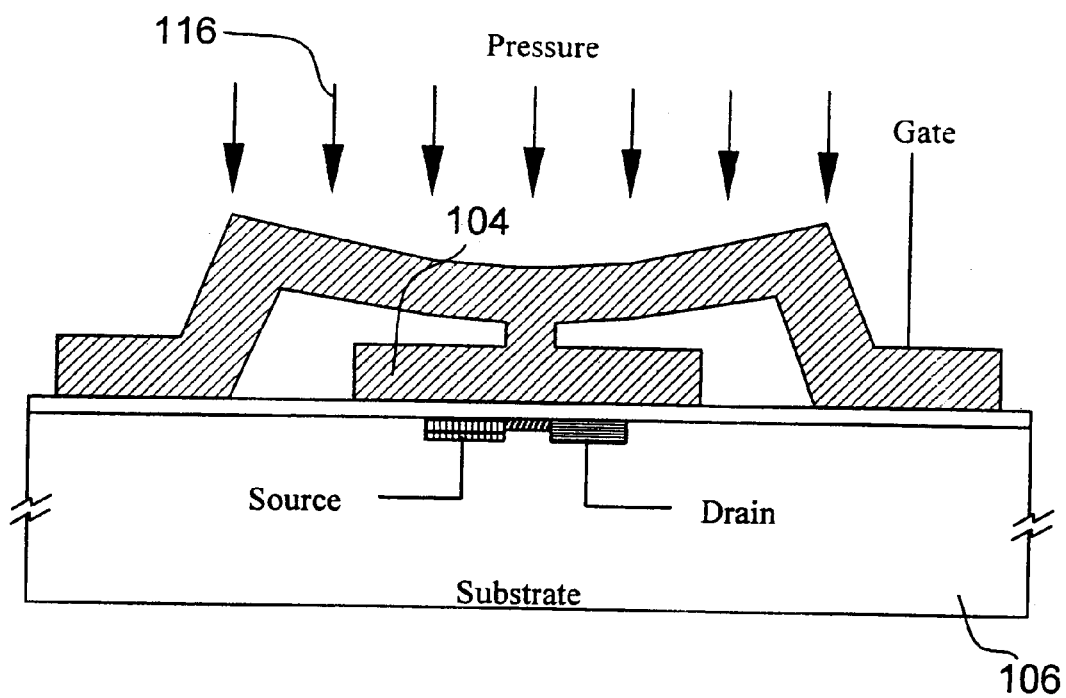
FIG. 8 is a schematic diagram showing the MOGFET-type pressure sensor of FIG. 7, with the diaphragm in a deformed position.

FIG. 7 is a schematic diagram showing a MOGFET-type pressure sensor having a channel implant 112 in accordance with another illustrative embodiment of the present invention. The channel implant 112 provides a leakage path from the source implant region 108 to the drain implant region 110. Thus, the MOGFET device is in an "on" state, even when the electrode plate 104 is not substantially deformed. As the electrode plate 104 approaches the substrate 106 due to increased pressure 116, as shown in FIG. 8, the MOGFET device simply becomes "turned on" even further. Thus, this configuration may be especially suitable for a pressure transducer type sensor.

Figure 9:
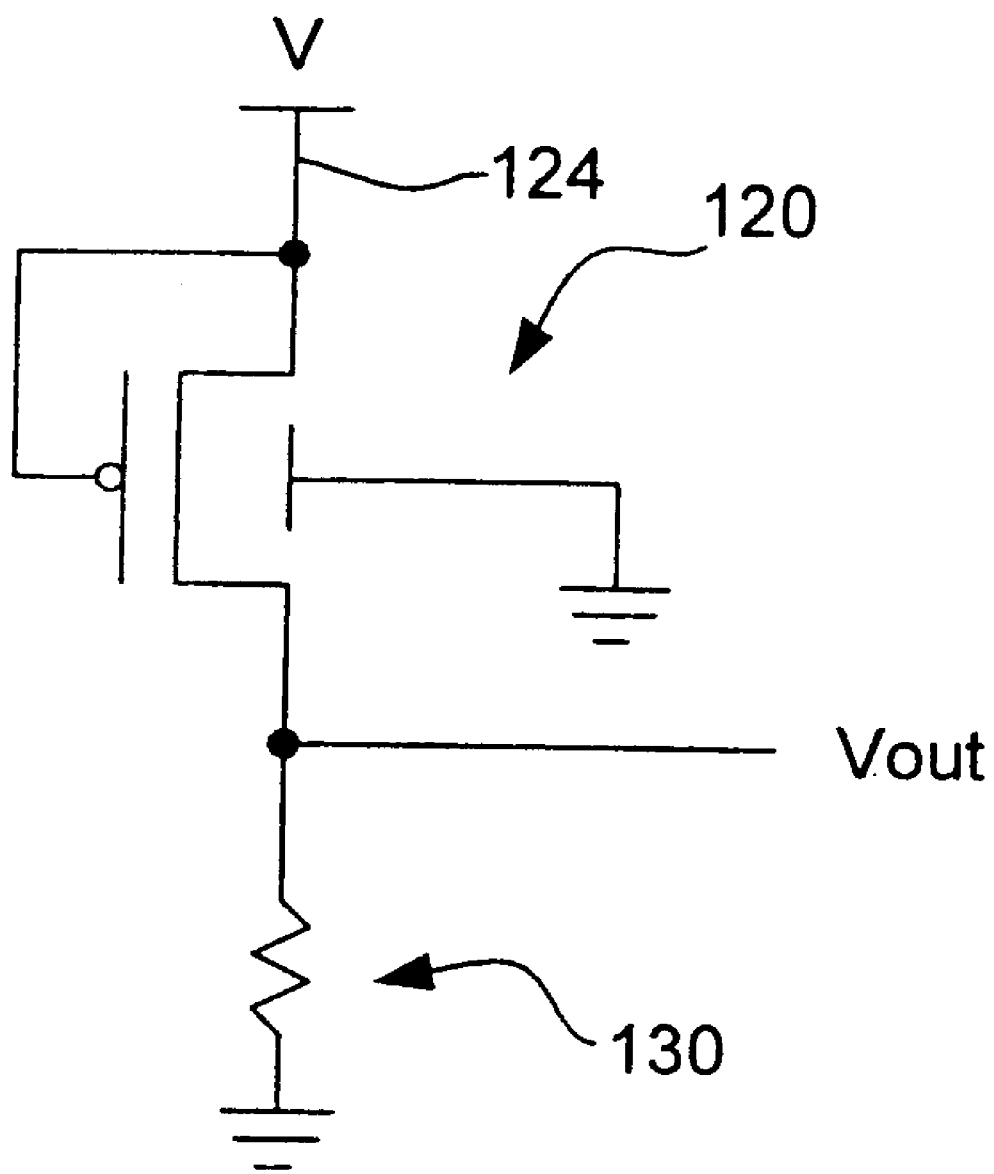
FIG. 9 is a schematic diagram of an illustrative test circuit for testing the MOGFET of FIGS. 6–8.

FIG. 9 is a schematic diagram of an illustrative test circuit for testing or using the MOGFET of FIGS. 6–8. It is assumed that the MOGFET device 120 is an n-type MOGFET device, having a p-type substrate. However, it is contemplated that a similar circuit can be constructed for a p-type MOGFET device. The source of the MOGFET device 120 is coupled to a voltage 124, and the drain is coupled to the output node "Vout". A resistor 130 provides a resistive path from the output node Vout to ground. The p-type substrate of the MOGFET device 120 is coupled to ground. In this configuration, as the electrode plate (i.e. gate) deforms toward the substrate due to increased outside pressure, the MOGFET device 120 turns on, causing the output node Vout to rise. The voltage at the output node Vout will thus be related to the pressure applied to the pressure sensor.

Figure 10:
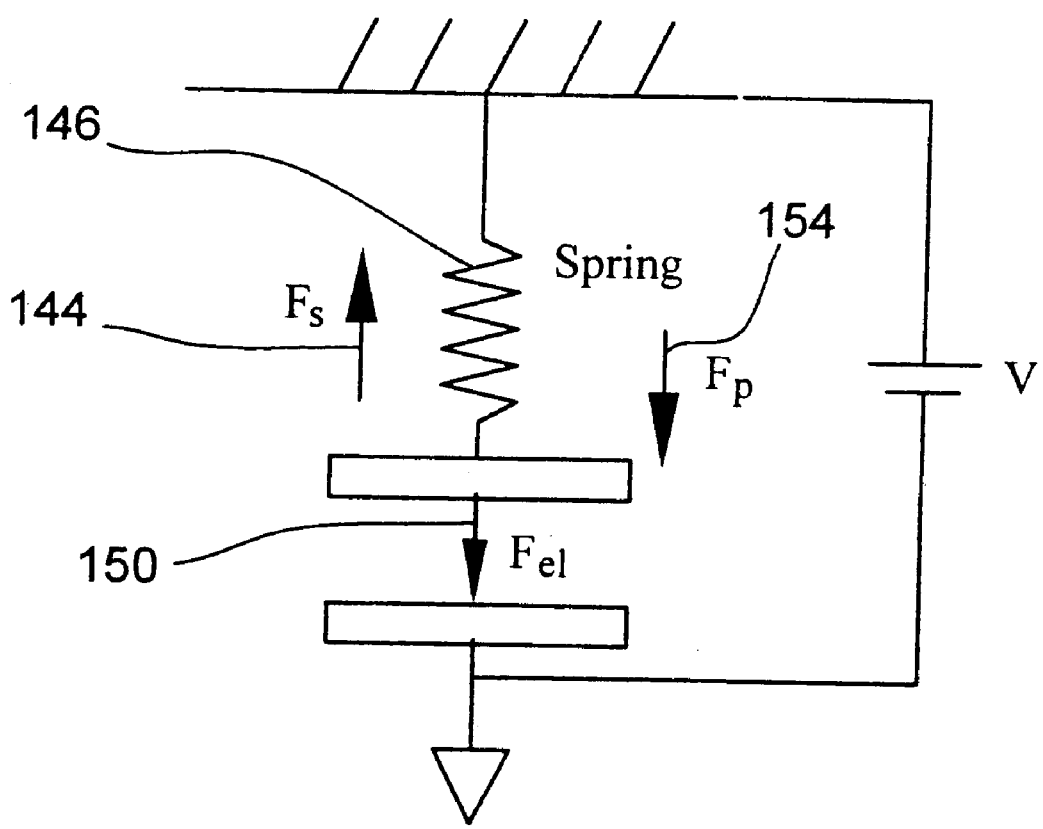
FIG. 10 is a schematic diagram showing illustrative forces on the diaphragm during normal functional operation of the sensors shown in FIGS. 2–8.

FIG. 10 is a schematic diagram showing illustrative forces on the diaphragm during normal functional operation of the sensors shown in, for example, FIGS. 2–8. In an illustrative pressure switch embodiment, the electrode plate and the substrate are conductive and have a voltage applied therebetween. This voltage causes an electrostatic force, $F_{e1}$, 150 between the substrate and the electrode plate, wherein the electrostatic force 150 is inversely proportional to the square of the distance between the electrode plate and the substrate.

The support member provides a deformation force 144 that is opposite to the applied pressure 154 and to the electrostatic force 150. The deformation force 144 also increases as the support plate deforms closer to the substrate. Because of the strong dependence of the electrostatic force with electrode distance, the electrode plate tends to snap toward the substrate when the applied pressure force 154 and the electrostatic force 150 overcome the deformation force 144. This snapping action can be used effectively to form a switch.

For a capacitive type sensor, the snapping action of the electrode plate, as described above, may provide a transition from a lower capacitance state to a higher capacitance state. For a MOGFET-type sensor, the snapping action of the electrode plate may provide a transition from an "off" FET device to an "on" FET device.

It is recognized that the support member and the electrode plate may be designed to provide little or no snapping action. This may be accomplished by, for example, increasing the thickness and thus the deformation force 144 of the support member, decreasing the voltage that is applied to the electrode plate to decrease the electrostatic force, decreasing the size of the electrode plate, etc. This may be desirable, for example, when producing transducer type sensors that measure the value of parameter rather than a threshold value or the like.

The electrostatic force 150 between the diaphragm and the substrate may be used to provide hysteresis to a pressure switch. In FIG. 10, the diaphragm is modeled as a mechanical spring 146. The spring force, $F_s$, has a direction that is opposite to the applied pressure, and is expressed by Hook's law:

$$F_s = Ky \tag{1}$$

where K is the spring constant of the diaphragm and y is the displacement of the center of the diaphragm. There are two different effective spring constants involved, including the spring constant corresponding to the force applied to the center of the diaphragm by the electrostatic force, $F_{e1}$, via the electrode plate, and the spring constant corresponding to the uniform pressure, $F_p$, applied to the top of the diaphragm. If a circular diaphragm is used, the spring constants for the center force, $K_p$, and for uniform pressure, $K_q$, are as follows:

$$K_P = \frac{4\pi E h^3}{3a^2(1-v^2)} \ [N/m] \quad F_P = K_P \cdot y \tag{2}$$

$$K_q = \frac{16 E h^3}{3a^4(1-v^2)} \ [N/m^3] \quad \text{Pressure} = K_q \cdot y \tag{3}$$

where y: displacement of the center of the plate a: plate radius

E: Young's modulus h: plate thickness v: Poisson's ratio.

The electrostatic force between the two parallel plates is given by the expression:

$$F_{el} = \frac{\varepsilon V^2 A}{2g^2} \tag{4}$$

∈: dielectric constant

V: voltage g: gap between two electrodes

A: electrode area.

When there are insulating layers on the electrodes, the actual electrostatic force on the each plate is the sum of the electrode force and the force at the insulator/air interface. These forces are given by the expressions:

$$F_{el} = F_1 + F_{12} = \frac{\varepsilon_{ox}^2 \varepsilon_o V^2 A}{2(2\varepsilon_o t_{ox} + \varepsilon_{ox} d)^2} \quad (5)$$

$$F_1 = \frac{\varepsilon_{ox} \varepsilon_o^2 V^2 A}{2(2\varepsilon_o t_{ox} + \varepsilon_{ox} d)^2} : \text{electrode force} \quad (6)$$

$$F_{12} = \frac{(\varepsilon_{ox} - \varepsilon_o)\varepsilon_{ox}\varepsilon_o V^2}{2(2\varepsilon_o t_{ox} + \varepsilon_{ox} d)^2} : \text{force between dielectric materials} \quad (7)$$

where $\in_{ox}$ is the dielectric constant of the silicon dioxide as an insulating layer, $\in_o$ is the dielectric constant of the air gap, $t_{ox}$ is the oxide layer thickness, and A is the electrode area. If the two plates touch, the attraction force is $$F_{el}(d=0) = \frac{\varepsilon_{ox} V^2 A}{8 t_{ox}^2} \quad (8)$$

because there is no dielectric interface force, $F_{12}$.

The electrostatic force is a concave function when plotted against the electrode separation distance. When the slope of the electrostatic force is the same as the spring constant of the diaphragm, the electrostatic force is the same as the spring force. At that distance, $d_c$, the diaphragm starts to collapse. The slope of the electrostatic force is given by the expression:

$$\frac{\partial F_{el}}{\partial d} = \frac{\varepsilon_{ox}^3 \varepsilon_o V^2 A}{(2\varepsilon_o t_{ox} + \varepsilon_{ox} d)^3} \quad (9)$$

When this equals $K_p + K_q$ (the sum of the spring constant of the diaphragm), the pull-in distance, $d_c$, can be calculated using the following expression:

$$d_c = \sqrt[3]{\frac{\varepsilon_o V^2 A}{K_p}} - \frac{2\varepsilon_o t_{ox}}{\varepsilon_{ox}} \quad (10)$$

The pull in force, $F_{PI}$, is calculated for a "turn on" pressure threshold, $P_t$. The displacement, y, of the center of the support member of the diaphragm at the threshold pressure, $P_t$, without the electrostatic force is given by the expression;

$$y = \frac{P_t}{K_q} \quad (11)$$

The equivalent center force, $F_{PI}$, is:

$$F_{PI} = K_p \cdot y = \frac{K_p P_t}{K_q} \quad (12)$$

When the diaphragm is pulled down, the forces have the relation given by:

$$F_s(d_c) < F_{e1}(d_c) + F_{PI} \quad (13)$$

From equations (11) and (12), the threshold pressure can be calculated using the expression:

$$P_t = \frac{K_q}{K_p}(F_s(d_c) - F_{el}(d_c)) \quad (14)$$

In a preferred embodiment, the diaphragm is pulled down to the substrate by the electrostatic force after a threshold pressure is exceeded. The diaphragm stays down, even when the applied pressure on the diaphragm is reduced slightly because the electrostatic force has increased when the two plates snapped together. To reopen the switch, the restoring spring force, $F_s$, must exceed the sum of the attraction forces including the electrostatic force and the applied pressure force. The attraction forces are reduced when the applied pressure on the diaphragm is reduced. When the attraction forces are reduced to less than the spring force, $F_s(d=0)$, suddenly the diaphragm is released and the switch opens. That is;

$$F_s(d=0) > F_{e1}(d=0) + F_{Po} \quad (15)$$

where $F_{Po}$ is the pressure force for opening the switch. The threshold pressure, $P_o$, at which the pressure switch opens is given by the expression:

$$P_o = \frac{K_q F_{Po}}{K_p} \quad (16)$$

and from equations (15) and (16), the threshold pressure, $P_o$, is given by the expression:

$$P_o = \frac{K_q}{K_p}(F_s(0) - F_{el}(0)) \quad (17)$$

As indicated above, the applied pressure causes the diaphragm to deform toward the substrate. When deformed, the electrostatic attraction force is increased because the distance between the electrode plate and the substrate decreases. When the diaphragm deflects to a point where the electrostatic attraction and the outside pressure exceeds the restoring spring force (deformation force) of the diaphragm, the diaphragm snaps to close the pressure switch. Preferably, the pressure switch does not open again when small fluctuations in pressure occur around the closing point. That is, it is helpful for the pressure switch to have a certain degree of hysteresis. Accordingly, the reopening pressure is preferably designed to be somewhat lower than the closing pressure, as shown in FIG. 11.

Figure 11:
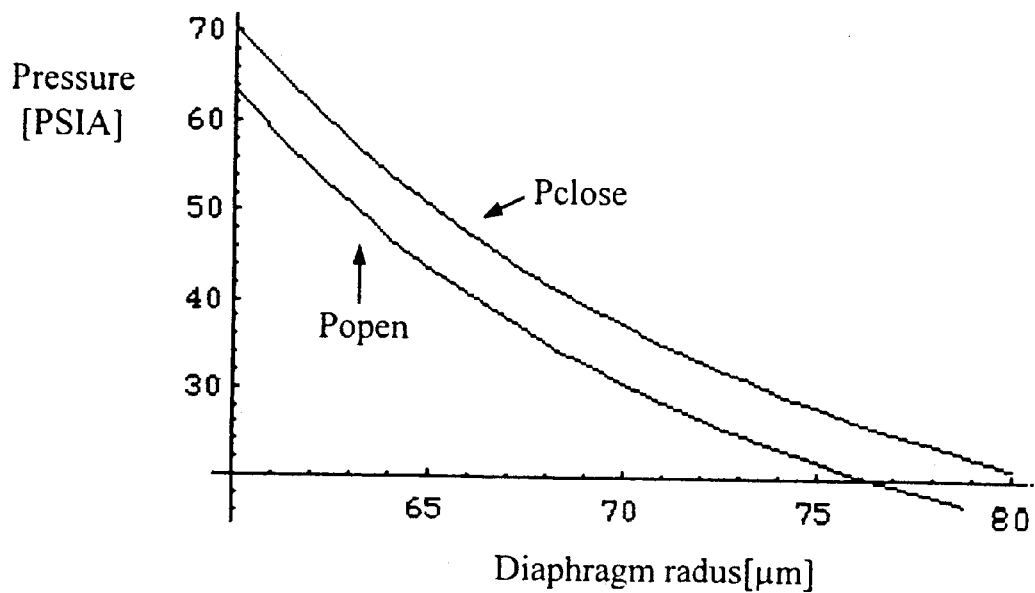
FIG. 11 is a graph showing illustrative switch open and close pressures for various diaphragm radii.

FIG. 11 is a graph showing the dependence of switch opening and closing pressures on the diaphragm radii. As the radius of the diaphragm increases, the spring force, $F_s$, provided by the diaphragm decreases. Thus, for a given electrode radius, and thus for a given electrostatic force, $F_{e1}$, the threshold pressure for both opening and closing the switch decreases, as shown in FIG. 11.

Figure 12:
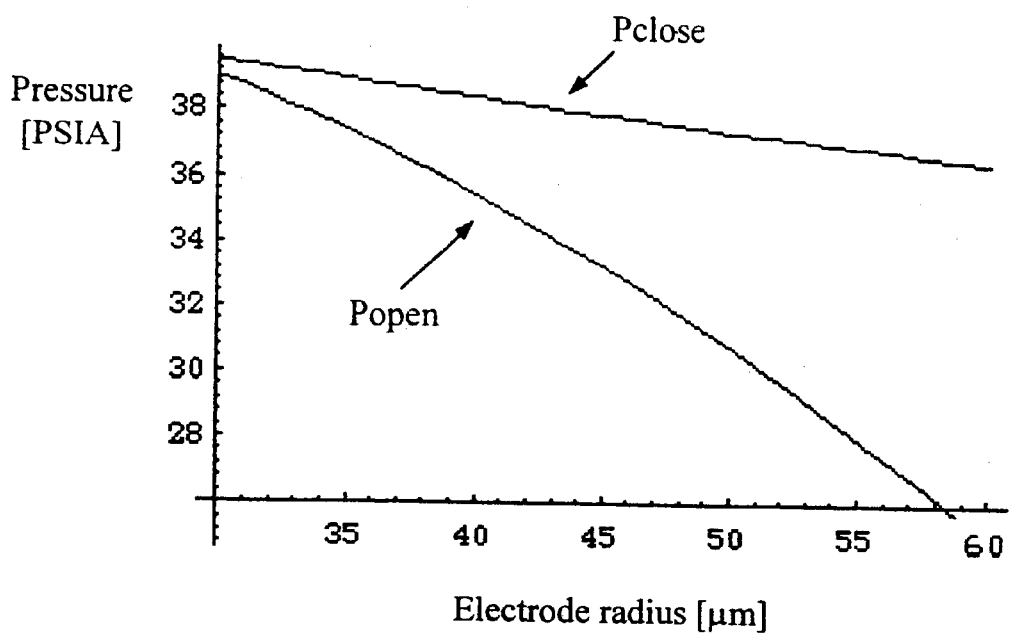
FIG. 12 is a graph showing illustrative switch open and close pressures for various electrode radii.

FIG. 12 is a graph showing illustrative switch open and close pressures versus electrode radii. As the radius of the electrode plate increases, the electrostatic force, $F_{e1}$, also increases. Thus, for a given diaphragm radius, and thus for a given spring force, $F_s$, the threshold pressure for both opening and closing the switch tends to decrease. However, the threshold pressure for opening the switch decreases faster than the threshold pressure for closing the switch. Thus, the amount of hysteresis provided by the switch may be increased by increasing the radius of the electrode.

Figure 13:
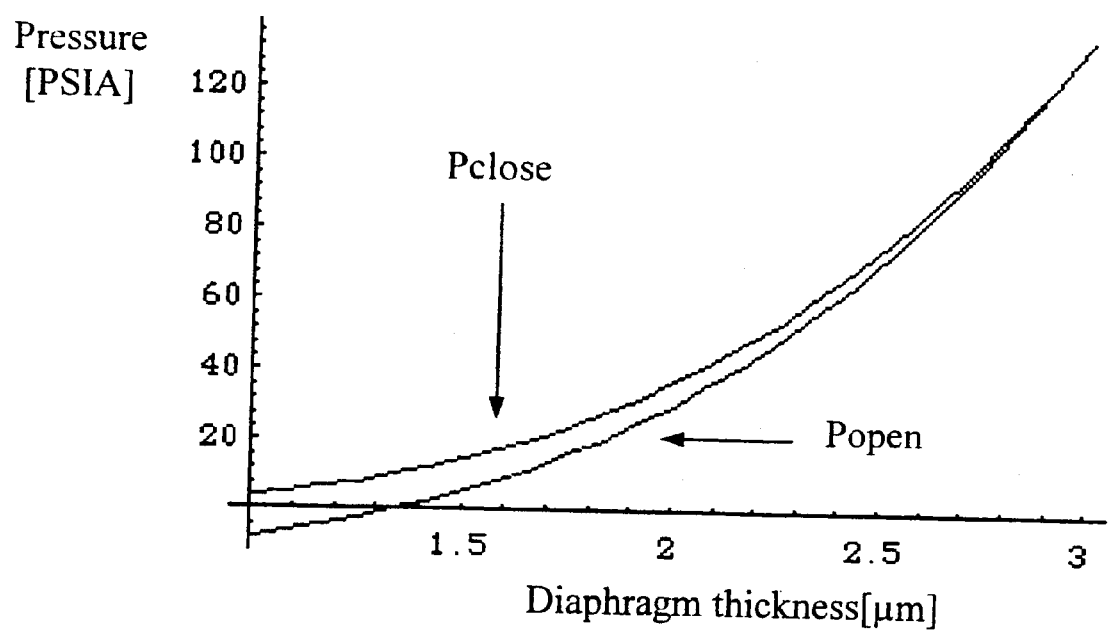
FIG. 13 is a graph showing illustrative switch open and close pressures for various diaphragm thicknesses.

FIG. 13 shows an illustrative switch opening and closing pressure versus diaphragm thicknesses. The spring force provided by the diaphragm increases as the diaphragm thickness increases. Thus, for a very thin diaphragm, only a relatively low threshold pressure is required to switch the diaphragm from an open position to a closed position. As the thickness of the diaphragm increases, the threshold pressure required to switch the diaphragm from an open position to a closed position increases, as shown. As the thickness of the diaphragm is further increased, the spring force, $F_s$, begins to dominate relative to the electrostatic force, $F_{e1}$, and the applied pressure force, $F_p$. Thus, as the diaphragm thickness increases, the spring force, $F_s$, increases, and the difference between the threshold pressures for opening and closing the switch decreases, as shown. To eliminate diaphragm switching or snapping altogether, the diaphragm thickness may be increased so that the closing pressure threshold is above the expected applied pressures.

As can readily be seen, a pressure sensor can be designed to have any number or characteristics including no switching threshold, a desired switching threshold, a desired amount of hysteresis, etc. In addition, with multiple devices with slightly different design characteristics, sensors having multiple threshold pressure points can be fabricated in a relatively small area.

Figure 14A:
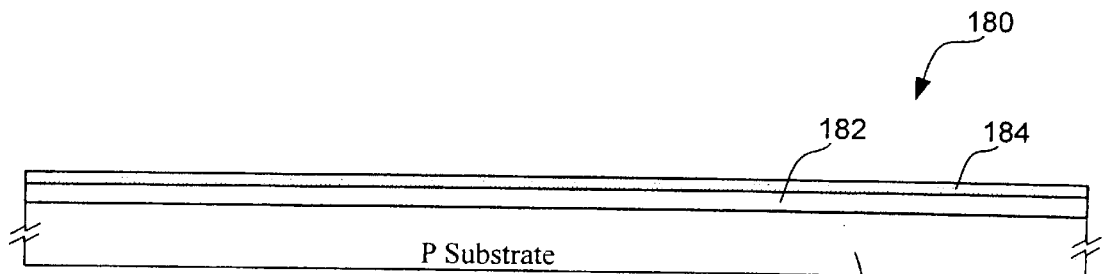
FIGS. 14A–14N show an illustrative method for forming a pressure sensor in accordance with the present invention.
Figure 14B:
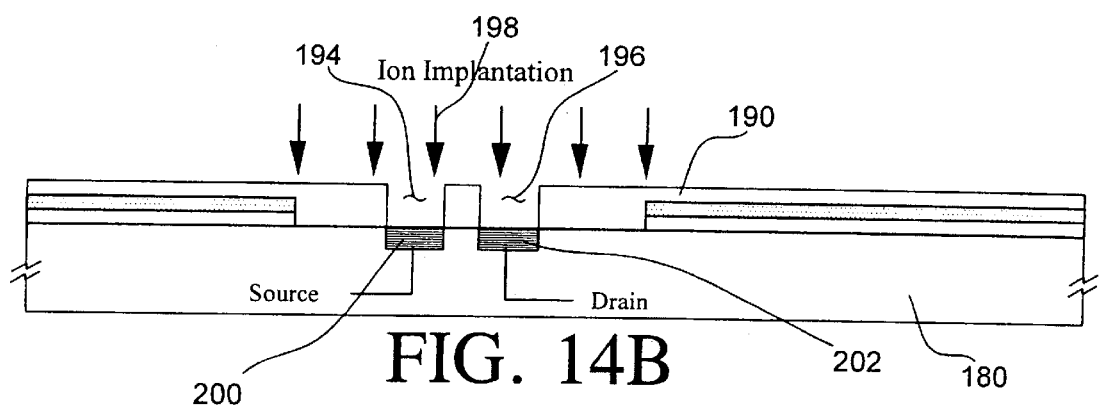
Figure 14C:
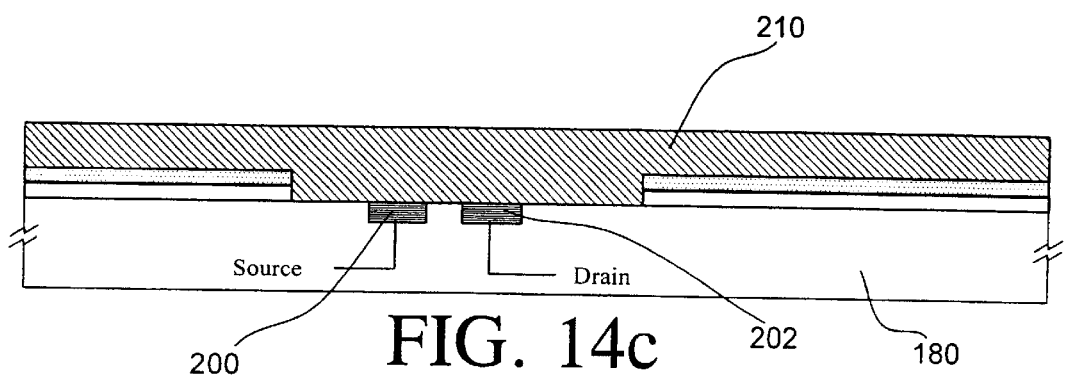
Figure 14D:
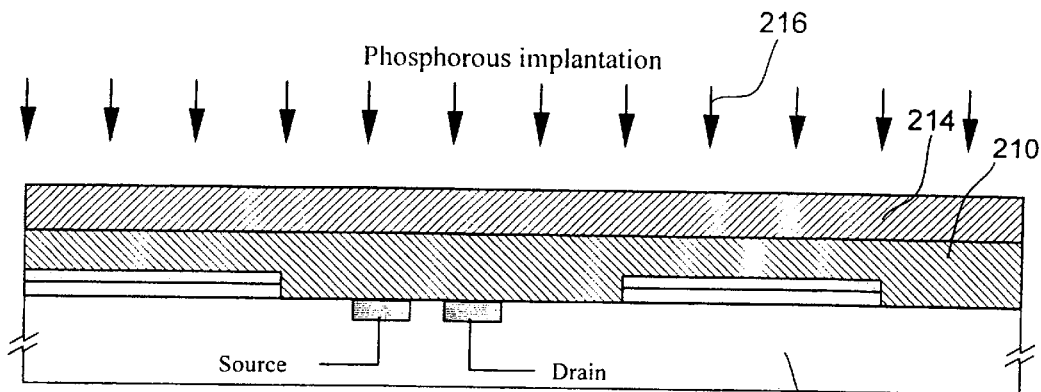
Figure 14E:
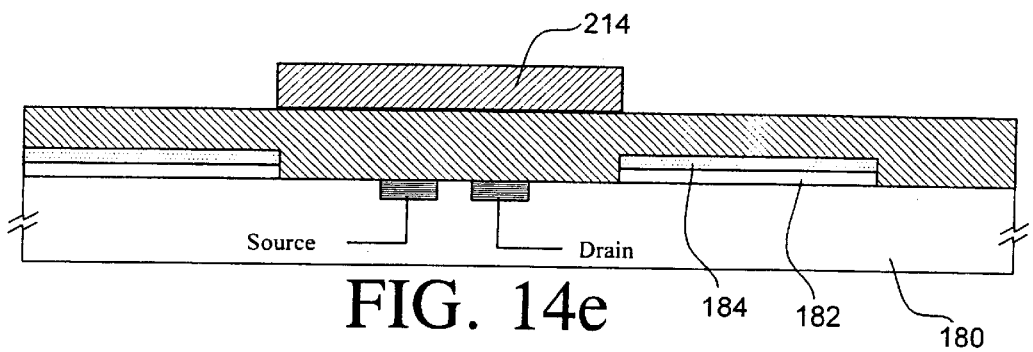
Figure 14F:
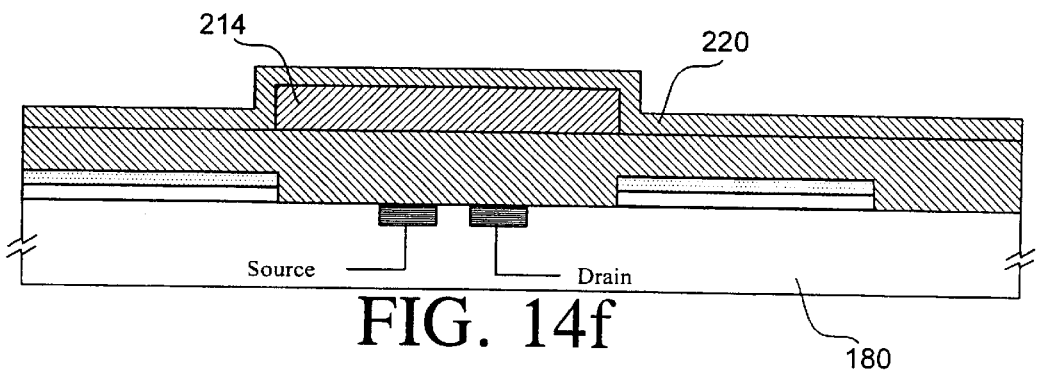
Figure 14G:
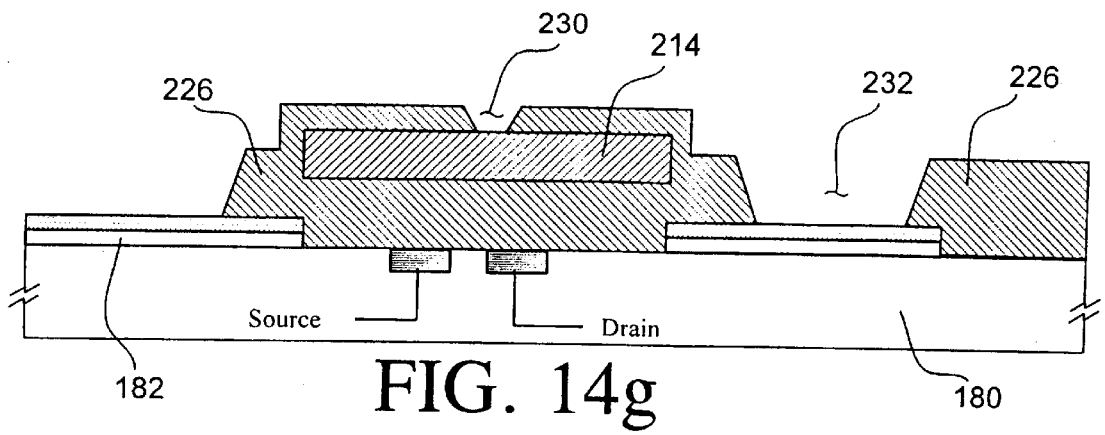
Figure 14H:
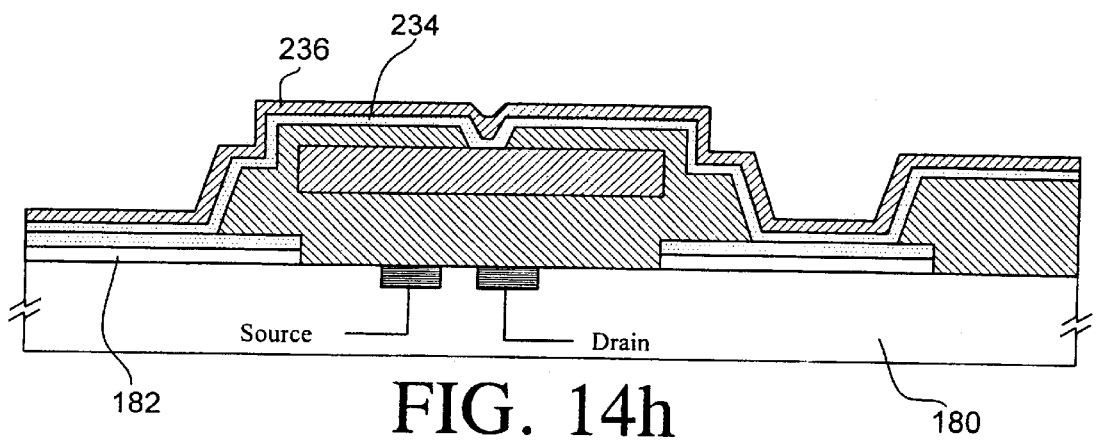
Figure 14I:
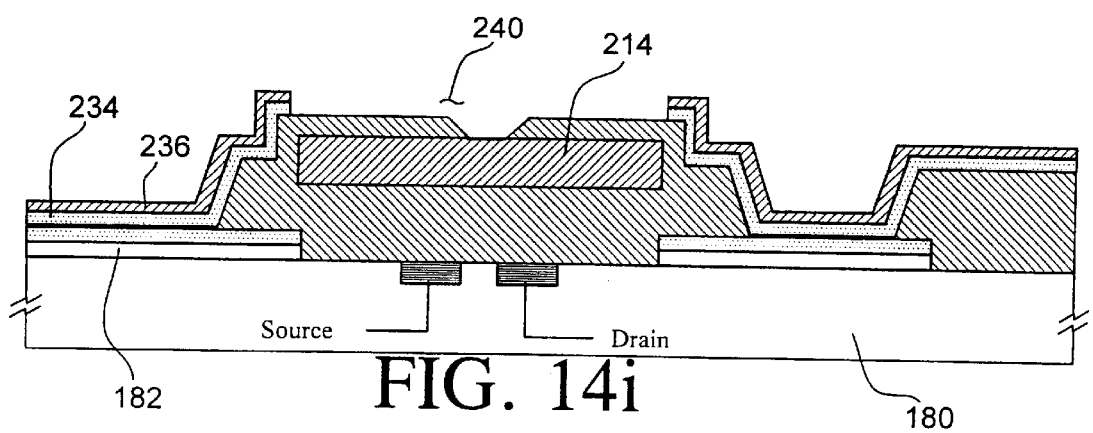
Figure 14J:
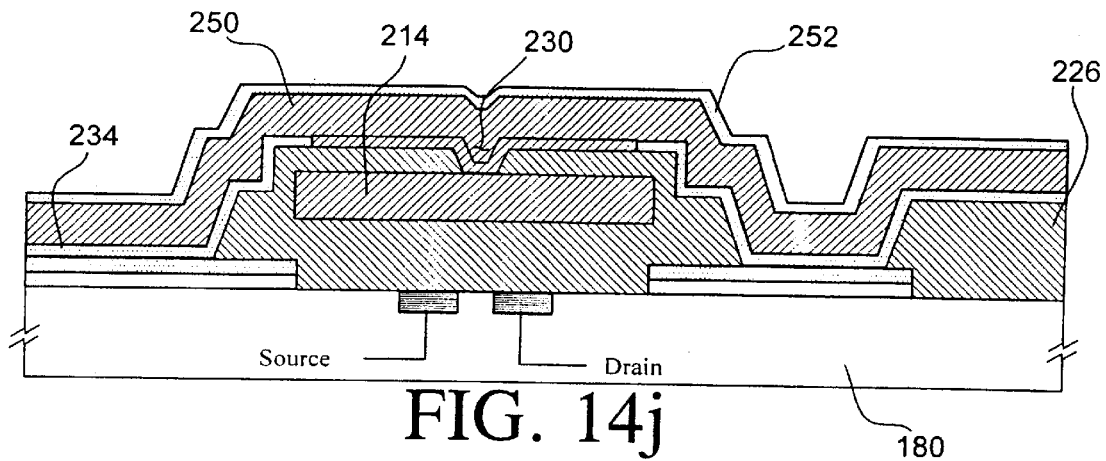
Figure 14K:
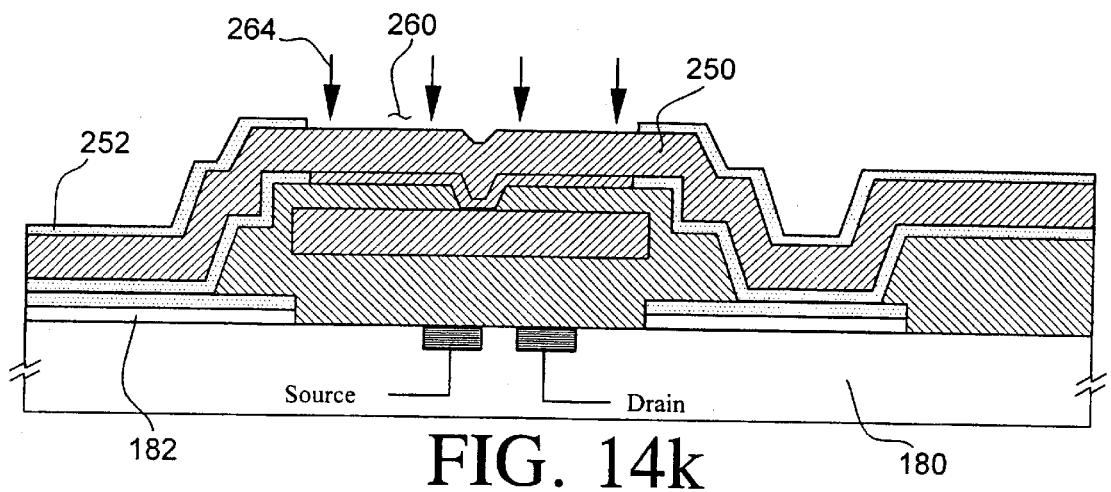
Figure 14L:
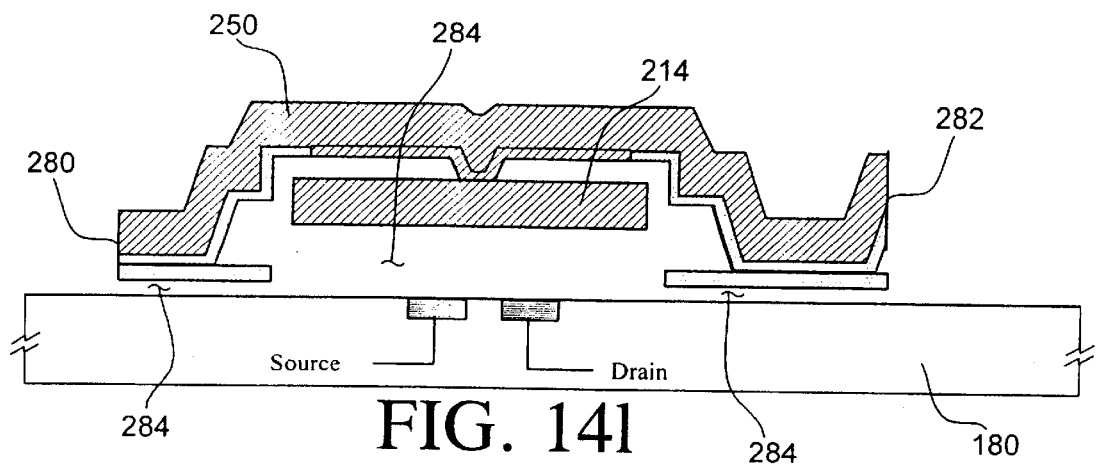
Figure 14M:
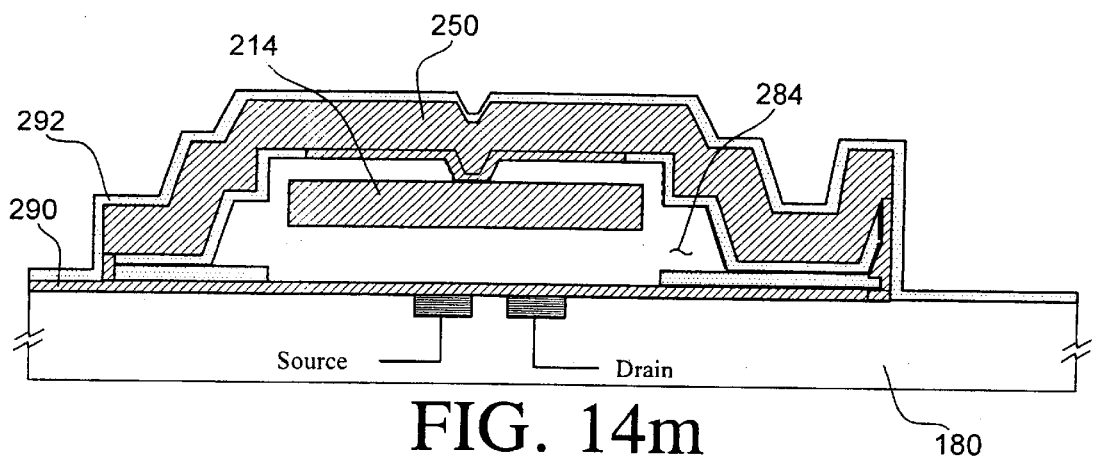
Figure 14N:
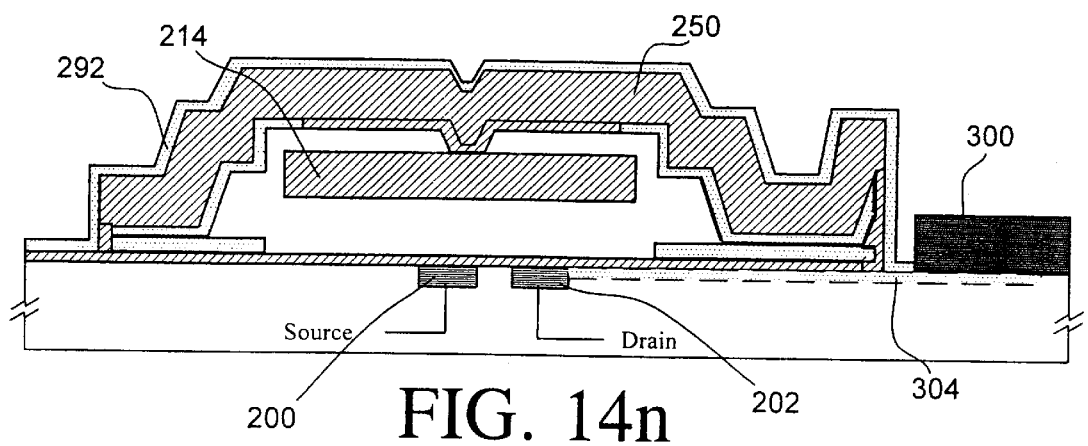

FIGS. 14A–14N show an illustrative method for forming the sensors of FIGS. 2–8. The first steps shown include depositing an etch channel structure on a substrate 180. FIG. 14A shows a p-type substrate 180 with an etch channel structure deposited thereon. The etch channel structure is formed by growing approximately 500 Å of oxide and then depositing about 800 Å of silicon nitride.

After the etch channel structure is formed, the source implant region 200 and the drain implant region 202 are provided, as shown in FIG. 14B. In the illustrative method, this is accomplished by selectively removing the etch channel structure, thereby exposing part of the substrate. A photoresist layer 190 is then provided over the top surface of the etch channel structure and the exposed portion of the substrate. The photoresist layer 190 is then patterned and etched to expose the source implant region 200 and the drain implant region 202. Then the source implant region 200 and the drain implant region 202 are implanted with an ion implant 198. Finally, the photoresist layer 190 is removed by conventional methods.

Although FIG. 14B shows a source implant region 200 and a drain implant region 202, it is contemplated that a single implant region may be provided to form a lower electrode for a capacitive type sensor. Alternatively, or in addition to, a metal layer may be provided on top of the exposed portion of the substrate to form the lower electrode.

Once the source implant region 200 and the drain implant region 202 are formed, an oxide layer 210 is deposited, as shown in FIG. 14C. A polysilicon layer 214 is then deposited on the oxide layer 210. A blanket phosphorous implant 216 can then be used to render the polysilicon layer 214 conductive, as shown in FIG. 14D. Alternatively, the oxide layer 210 may includes phosphorous, such as POCL. The phosphorous in the POCL may migrate into the adjacent polysilicon layer 214, thereby eliminating the blanket phosphorous implant 216 step discussed above.

Next, the polysilicon layer 214 is patterned and etched, as shown in FIG. 14E. The remaining portion of the polysilicon layer 214 will form the electrode plate of the diaphragm, as further discussed below. Thereafter, another oxide layer 220 is deposited, as shown in FIG. 14F. The oxide layer 220 is preferably about 4000 Å thick, and covers the polysilicon layer 214.

The oxide layer 210 and oxide layer 220 are then etched down to the etch channel structure on each side of the pressure sensor, as shown at 232 in FIG. 14G. In addition, a hole or VIA 230 is etched down to the polysilicon layer 214. The hole or VIA 230 is preferably positioned at the center of the polysilicon layer 214. The remaining oxide material forms a sacrificial layer, as shown at 226. While the sacrificial layer 226 is shown to be an oxide, it is contemplated that other materials may also be used including silicon dioxide, polyimide, photoresist, various polymers, doped silicon, and/or metals, depending on the diaphragm material and selective etch techniques.

Next, an insulating nitride layer 234 is deposited, followed by a polysilicon layer deposition 236, as shown in FIG. 14H. As shown in FIG. 14I, the polysilicon layer 236 and nitride layer 234 are etched away in a region 240. Region 240 is located above the electrode plate 214. Thereafter, another polysilicon layer 250 is deposited, as shown in FIG. 14J. The polysilicon layer 250 extends over the sacrificial layer 226 and forms the support member of the diaphragm. The portion of the polysilicon layer 250 that extends into the hole or via 230 forms a post that connects the polysilicon layer 250 to the electrode plate 214. A nitride layer 252 is then deposited over the polysilicon layer 250, also as shown in FIG. 14J.

A region 260 of the nitride layer 252 is then etched away. A blanket phosphorous implant 264 is used to render at least the exposed portion of the polysilicon layer 250 conductive, as shown in FIG. 14K. Alternatively, an oxide layer (not shown) may be provided that includes a phosphorous, such as POCL. The phosphorous in the POCL oxide migrates into at least the exposed portion of the polysilicon layer 250 to render it conductive.

Thereafter, and as shown in FIG. 14L, the edges 280 and 282 of the sensor are etched down to the oxide layer 182 of the etch channel structure. A cavity etch is then used to remove the oxide layer 182 of the etch channel structure and the sacrificial layer 226 to form a cavity 284. Preferably, there are a number of spaced etch channel structures extending from outside the sensor into the cavity 284. To seal the cavity 284, an oxide layer 290 is grown on the surface of the substrate. Then a nitride passivation layer 292 is provided over the entire sensor structure, as shown in FIG. 14M. The sealing step may be performed in an atmosphere that has a desired pressure to set the pressure in the cavity 284.

Finally, one or more metal contacts may be provided for providing a connection point to the source implant region 200, the drain implant region 202, the diaphragm (214, 250), and/or the substrate 180. In the illustrative diagram shown in FIG. 14N, a metal contact 300 is provided by selectively etching the nitride layer 292 from a desired location and depositing and patterning the metal layer as desired. It is contemplated that the drain implant region 202 may be connected to the metal contact 300 by simply extending the implant region 202 further to the right, as shown at 304. The source implant region 200 may be similarly connected to a metal contact.

Having thus described the preferred embodiments of the present invention, those of skill in the art will readily appreciate that the teachings found herein may be applied to yet other embodiments within the scope of the claims hereto attached.

What is claimed is:

1. A sensor assembly for sensing an externally generated force, comprising:
    a substrate having an upper surface;
    electrode means positioned above at least a portion of the upper surface of the substrate, the electrode means being mounted such that a movable portion of the electrode means moves toward or away from the substrate when the sensor assembly is subjected to the externally generated force;
    the movable portion of the electrode means having a support portion and an electrode portion, wherein the support portion and the electrode portion are non-planar, the support portion at least partially deforming as the movable portion of the electrode means moves toward or away from the substrate, and the electrode portion remaining substantially undeformed as the movable portion of the electrode means moves toward or away from the substrate, the electrode portion having a lower surface that faces the upper surface of the substrate, the lower surface of the electrode portion and the upper surface of the substrate remaining substantially parallel as the movable portion of the electrode means moves toward or away from the substrate in response to the externally generated force;
    at least one terminal electrically connected to the substrate; and
    at least one terminal electrically connected to the electrode means.

2. A sensor assembly according to claim 1,
    wherein the support portion is a support member that deforms when the moveable portion of the electrode means moves toward or away from the substrate, the support member providing a deformation force opposite to the externally generated force; and
    wherein the electrode portion is an electrode plate that is operatively attached to the support member by means of a post member.

3. A sensor assembly according to claim 1, wherein the electrode portion and the substrate are conductive with a voltage applied thereto, the voltage causing an electrostatic force between the substrate and the electrode portion, the electrostatic force increasing as the electrode portion moves closer to the substrate, the electrode portion snapping toward the substrate when the externally generated force and the electrostatic force overcome the deformation force.

4. A sensor transistor according to claim 3, further comprising a dielectric layer between the electrode portion and the substrate.

5. A sensor assembly according to claim 1, wherein the support portion is a circular diaphragm that is monolithically formed on the substrate, wherein the diaphragm has a center region.

6. A sensor assembly according to claim 1, wherein the support portion has a shape selected from the group consisting of circular, square, rectangular, and triangular.

7. A sensor assembly according to claim 5, wherein the electrode portion is a conductive plate that is operatively attached to the center region of the diaphragm.

8. A sensor assembly according to claim 7, wherein the diaphragm and the substrate form a cavity.

9. A sensor assembly according to claim 7, wherein the electrode portion is located in the cavity.

10. A sensor assembly according to claim 1, wherein the electrode means forms one electrode and the substrate forms another electrode.

11. A sensor assembly according to claim 10, wherein the electrode means and the substrate have a dielectric layer interposed therebetween.

12. A sensor assembly according to claim 11, wherein the dielectric substance includes an oxide.

13. A sensor assembly according to claim 11, wherein the dielectric substance includes a gas or vacuum.

14. A sensor assembly according to claim 11, wherein the dielectric substance includes an oxide layer adjacent a gas layer.

15. A sensor assembly according to claim 1, wherein the substrate has an implant region, and wherein the implant region is positioned below at least part of the electrode means.

16. A sensor assembly according to claim 1, wherein the substrate includes a source implant region and a drain implant region, wherein the source implant region is spaced from the drain implant region by a gap.

17. A sensor assembly according to claim 16, wherein the electrode means is positioned above at least part of the gap.

18. A sensor assembly according to claim 17, wherein the source implant region, the drain implant region, and the electrode means form the source, drain, and gate of a MOGFET (Movable Gate Field Effect Transistor).

19. A sensor assembly for sensing an externally generated force, comprising:
    a substrate having an upper surface;
    a support member positioned above at least a portion of the upper surface of the substrate, the support member being mounted such that a first portion of the support member moves toward or away from the substrate more than a second portion of the support member when the support member is subjected to the externally generated force;
    an electrode plate having a lower surface that faces the upper surface of the substrate, the electrode plate being operatively attached below the first portion of the support member such that the lower surface of the electrode plate moves substantially uniformly toward or away from the upper surface of the substrate when the support member is subjected to the externally generated force;
    at least one terminal electrically connected to the substrate; and
    at least one terminal electrically connected to the electrode plate.

20. A sensor assembly according to claim 19, wherein the lower surface of the electrode plate and the upper surface of the substrate remain substantially parallel when the support member is subjected to the externally generated force.

21. A sensor assembly according to claim 20, wherein the support member is a circular diaphragm that is monolithically formed on the substrate, wherein the diaphragm has a center region.

22. A sensor assembly according to claim 21, wherein the electrode plate is a conductive plate that is operatively attached to the center region of the diaphragm.

23. A sensor assembly according to claim 22, wherein the electrode plate is operatively attached to the center region of the diaphragm via a post member.

24. A sensor assembly according to claim 23, wherein the post member is a CMOS VIA structure.

25. A sensor assembly according to claim 24, wherein the electrode plate has a larger lateral dimension than the CMOS VIA structure.

26. A sensor assembly according to claim 25, wherein the diaphragm and the substrate form a cavity.

27. A sensor assembly according to claim 26, wherein the electrode plate is located in the cavity.

28. A sensor transistor, comprising:

a substrate having an upper surface;

a source implant region in the upper surface of the substrate;

a drain implant region in the upper surface of the substrate, the source implant region being spaced from the drain implant region by a gap region;

a gate means positioned above at least a portion of the gap region, at least a portion of the gate means moving toward or away from the substrate in response to an externally generated force applied to the gate means, the gate means having a support portion and an electrode portion, wherein the support portion and the electrode portion are non-planar, the support portion at least partially deforming as the at least a portion of the gate means moves toward or away from the substrate, and the electrode portion remaining substantially undeformed as the at least a portion of the gate means moves toward or away from the substrate, the electrode portion having a downward facing surface that remains substantially parallel to the upper surface of the substrate even when the gate means moves in response to the externally generated force;

at least one terminal electrically connected to the source implant;

at least one terminal electrically connected to the drain implant; and at least one terminal electrically connected to the gate means.

29. A sensor transistor according to claim 28, wherein the support portion is a support member that deforms when the plate moves toward or away from the substrate, the support member providing a deformation force opposite to the externally generated force; and wherein the electrode portion is an electrode member that is operatively attached to the support member by means of a post member.

30. A sensor transistor according to claim 28, wherein the electrode portion and the substrate are conductive with a voltage applied therebetween, thereby providing an electrostatic force between the substrate and the electrode portion, the electrostatic force increasing as the gate means moves closer to the substrate, the electrode portion snapping toward the substrate when the externally generated force and the electrostatic force overcome the deformation force.

31. A sensor transistor according to claim 30, further comprising a dielectric layer that is interposed between the electrode portion and the substrate.

32. A sensor transistor according to claim 28, further having a gap implant in the upper surface of the substrate in the gap region, the gap implant increasing the conductivity of the gap region.

33. A sensor assembly for sensing an externally generated force, comprising:

a substrate having an upper surface;

a diaphragm positioned above at least a portion of the upper surface of the substrate, the diaphragm including a support member positioned above an electrode plate, wherein at least one post member connects the electrode plate and the support member, the electrode plate being spaced from the support member and from the substrate;

at least one terminal electrically connected to the substrate; and at least one terminal electrically connected to the electrode plate.

34. A sensor assembly for sensing an externally generated force, comprising:

a plate having an upper surface;

electrode means positioned above at least a portion of the upper surface of the plate, the electrode means being mounted such that a movable portion of the electrode means moves relative to the plate when the sensor assembly is subject to the externally generated force, the electrode means including a support portion and an electrode portion, wherein the support portion and the electrode portion are non-planar, the support portion at least partially deforming as the movable portion of the electrode means moves toward or away from the substrate, and the electrode portion remaining substantially undeformed as the movable portion of the electrode means moves toward or away from the substrate, said electrode means providing a deformation force opposite to the externally generated force;

a first terminal electrically connected to the plate;

a second terminal electrically connected to the electrode means; and said electrode means and said plate having an electrostatic force therebetween when a voltage is applied between the first terminal and the second terminal, the electrostatic force increasing as the electrode means moves closer to the plate, the electrode means snapping toward the plate when the externally generated force and the electrostatic force overcome the deformation force.

35. A sensor assembly according to claim 34, wherein the plate is a substrate.

36. A sensor assembly according to claim 35, wherein the support portion includes a diaphragm.

37. A sensor assembly according to claim 36, wherein the support portion includes a support member that deforms when the moveable portion of the electrode means moves toward or away from the substrate, the support member providing a deformation force opposite to the externally generated force; and wherein the electrode portion is an electrode plate that is operatively attached to the support member by means of a post member.

* * * * *